July 30, 1974 R. A. GARDNER ET AL 3,826,813
PROCESS FOR THE PREPARATION OF MULLITE BY A SOLID STATE REACTION
Filed June 20, 1972
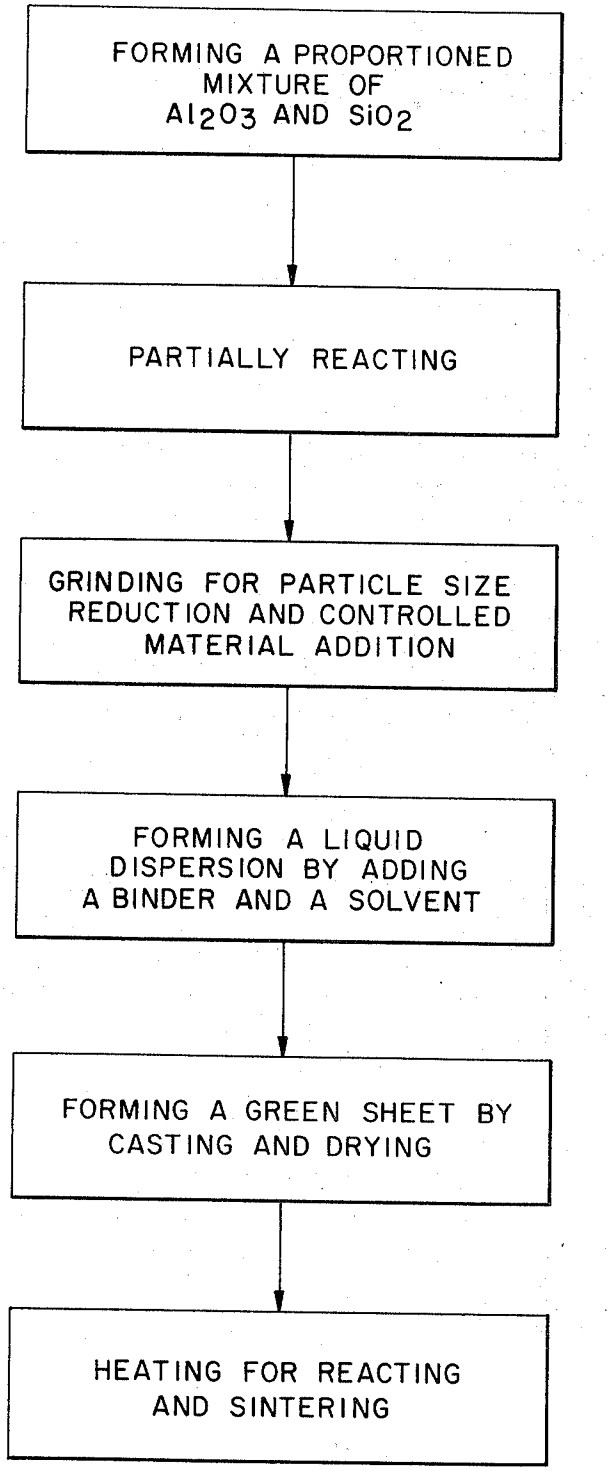

United States Patent Office 3,826,813
Patented July 30, 1974

3,826,813

PROCESS FOR THE PREPARATION OF MULLITE BY A SOLID STATE REACTION

Richard A. Gardner, Wappingers Falls, N.Y., and David L. Wilcox, San Jose, Calif., assignors to International Business Machines Corporation, Armonk, N.Y.

Filed June 20, 1972, Ser. No. 264,676
Int. Cl. C01b *33/26*
U.S. Cl. 423—328 4 Claims

ABSTRACT OF THE DISCLOSURE

A process for forming a high grade mullite $$3Al_2O_3 \cdot 2SiO_2$$

compound for use as an integrated circuit substrate including the steps of sintering an incompletely prereacted mullite and compensating for milling contamination by adjusting the stoichiometry of an initial mixture prior to a partial reacting step.

BACKGROUND OF THE INVENTION

This invention relates to a process for forming a high grade ceramic powder for use in fabricating substrates suitable for high speed integrated circuit devices.

Mulite has long been known in the ceramic and refractory industries. Mullite is one of the most stable compounds in the $Al_2O_3 \cdot SiO_2$ system. Consequently, it occurs as a main constituent in a large number of ceramic products which are fabricated from alumino-silicate materials. Considerable amounts of mullite are used to produce refractory bodies designed to withstand high temperatures. Its relatively low thermal coefficient of expansion makes such refractories more resistant to thermal stresses in contrast to similar bodies prepared from aluminum oxide materials.

Mullite possesses a dielectric constant of approximately 5–6, and therefore, presents a very attractive electrical characteristic as integrated circuit technology continues advancing to higher speed circuit devices. Moreover, mullite's low thermal coefficient of expansion offers an excellent match to large silicon integrated circuit chips or glasses which may be placed on substrates. Although mullite has been mentioned as a material for use in electronic substrates for integrated circuit devices, high grade and high density substrates are not known to exist.

Prior efforts have suggested the feasibility of preparing mullite from mechanically mixed alumina and silica. Related efforts have also concluded that sintering of mullite is promoted by the use of incompletely prereacted mullite and by the formation of a solid solution of alumina in 3/2 mullite.

However, this approach requires that the mullite powder be sufficiently reduced in particle size by mechanical milling or grinding. The mechanical milling or grinding, however, introduces contamination which prohibits the attainment of a high grade mullite powder capable of being sintered to a high density state.

SUMMARY OF THE INVENTION

It is therefore an object of the present invention to provide a process which eliminates the contamination of the mullite powder during the mechanical grinding or milling step.

In accordance with the aforementioned objects, the present invention provides a process for forming a high purity mullite powder capable of being sintered to a highly dense state by adjusting the stoichiometry of the initial mixture, partially reacting the mixture, and milling the mixture for particle size reduction and further stoichiometry adjustment.

The foregoing and other objects, features and advantages of the invention will be apparent from the following more particular description of the preferred embodiment of the invention as illustrated in the accompanying drawings.

BRIEF DESCRIPTION OF THE DRAWINGS

The sole drawing illustrates the basic steps of the present invention.

DESCRIPTION OF THE PREFERRED EMBODIMENT

Step 1

In the first step, an adjusted or proportioned stoichiometry of alumina and silica is formed in order to compensate for subsequent contamination during the mechanical milling or grinding process. For example, in one type alumina or $Al_2O_3$ grinding mill, it was heuristically determined that the grinding operation added about 4% $Al_2O_3$ contamination. The theoretical stoichiometric proportion for a $3Al_2O_3 \cdot 2SiO_2$ mullite composition is 71.8% $Al_2O_3$ and 28.2% $SiO_2$. Accordingly, during the mixing step, the initial mixture is formed in a proportion of 68% $Al_2O_3$ and 32% $SiO_2$. Although not critical, a .5 micron alumina particle size and a 5 micron silica or alumina silicate particle size was found suitable for implementation of the present invention.

The adjusted mechanical mixture of $Al_2O_3$ and $SiO_2$ is now in suitable form for the next step. The mixture can also be formed by combining alumina and aluminum silicate.

Step 2

The mechanical mixture is then subjected to a heating step in order to partially react the $Al_2O_3$ and $SiO_2$. The mixture is heated to a temperature in the range of between 1300–1400° C. for approximately one hour. By way of example, the mixture is placed in a ceramic container and then heated in an oven. The heating operation causes a partial chemical reaction so as to form a second mixture comprising $3Al_2O_3+2SiO_2$ and mullite or $3Al_2O_3 \cdot 2SiO_2$. It is possible that some minute 2/1 mullite, $2Al_2O_3 \cdot SiO_2$, is formed during the partial reacting step.

Step 3

Next, the partially reacted second mixture is comminuted by milling or grinding. In the preferred embodiment, an alumina or $Al_2O_3$ grinding mill is selected.

Thus, during the grinding or milling operation, the $Al_2O_3$ from the grinding operation enters the second mixture in a predetermined and known quantity, and thus produces a resulting stoichiometric compound having substantially the desired proportions as previously theoretically determined.

Although $Al_2O_3$ is selected as the controlled contaminant, either $Al_2O_3$ and/or $SiO_2$ are suitable as a grinding constituent. A milling operation which reduces the particle size in the range of .5 to 5 microns is most desirable, although not necessarily critical. Particle sizes greatly in excess of 5 microns are difficult to sinter and provide less desirable electrical characteristics when used as substrates for high-speed integrated circuits.

Step 4

During this step, the milled second mixture is combined with a binder and a solvent to form a liquid dispersion. By way of example, an adequate binder is formed by combining a polyvinylbutyral resin or polymer with a plasticizer, such as dioctylphthalate or dibutylphthalate. The plasticizer component in the binnder insures that the subsequently formed green sheet material attains a desired state of pliability. Other examples of suitable polymers are polyvinylformal, polyvinylchloride and polyvinylacetate.

Next, after the binder is mixed with the second mixture, a suitable solvent is added. The purpose of the solvent is to dissolve the plasticizer and resin so as to permit the binder to coat the ceramic particles in the mixture. Also, the solvent provides suitable viscosity for a subsequent casting step.

Step 5

During this step, a green sheet material of mullite is formed by casting and drying. In the preferred embodiment, doctor blading is selected as the method of casting or spreading the liquid dispersion to a suitable thickness. During doctor blading, a plastic carrier is pulled underneath a stationery knife so as to spread the liquid dispersion on the plastic carrier to the desired thickness. The doctor bladed liquid dispersion is then dried under ambient conditions in order to evaporate or remove the solvents.

Step 6

Finally, the green sheet material is heated in order to completely react and sinter the second mixture. The green sheet material is placed in an oven and the temperature raised to a range of between 1500–1600° C., and exposed to the heat for approximately three hours in order to obtain complete sintering.

An exothermic chemical reaction occurs and is given by the following formula:

$$3Al_2O_3 + 2SiO_2 + 3Al_2O_3 \cdot 2SiO_2 \xrightarrow{\Delta} 3Al_2O_3 \cdot 2SiO_2$$

The initial chemical reaction begins to occur around 980° C.; however, complete sintering requires that the green sheets remain at the higher elevated temperature for a suitable period of time after initial sintering begins at 980° C.

Although the invention has been particularly shown and described with reference to the preferred embodiments thereof, it will be understood by those skilled in the art that the foregoing and other changes in form and details may be made therein without departing from the spirit and scope of the invention.

What is claimed is:

1. A process for forming a high grade mullite $3Al_2O_3 \cdot 2SiO_2$ compound for use in fabricating an integrated circuit substrate comprising the steps of:

(a) forming a first mixture having alumina and a material selected from the group consisting of silica, and aluminum silicate, and adjusting the stoichiometry of said first mixture such that the alumina content is less than that required for $3Al_2O_3 \cdot 2SiO_2$, mullite, (b) heating said first mixture for partially reacting said first mixture and for forming a second mixture comprising $Al_2O_3+SiO_2$ and $3Al_2O_3 \cdot 2SiO_2$, (c) comminuting said second mixture with alumina so as to reduce the particle size of the second mixture to allow complete sintering and reacting in a single subsequent firing step, and to increase the amount of alumina in said second mixture so that the stoichiometric composition of mullite is provided in said second mixture, and (d) heating the comminuted second mixture to substantially completely react and sinter said second mixture to form a $3Al_2O_3 \cdot 2SiO_2$, mullite compound.

2. A process for forming a high grade mullite $3Al_2O_3 \cdot 2SiO_2$ compound for use in fabricating an integrated circuit substrate as in Claim 1 wherein said first mixture is formed by mechanically combining alumina, $Al_2O_3$, and silica, $SiO_2$.

3. A process for forming a high grade mullite $3Al_2O_3 \cdot 2SiO_2$ compound for use in fabricating an integrated circuit substrate as in Claim 1 wherein said first mixture is formed by mechanically combining alumina, $Al_2O_3$ and aluminum silicate.

4. A process for forming a high grade mullite $3Al_2O_3 \cdot 2SiO_2$ compound for use in fabricating an integrated circuit substrate as in Claim 1 further including the steps of forming a liquid dispersion from said resulting comminuted second mixture by adding binder and solvent materials and casting and drying said liquid dispersion to form green sheet material which is thereafter heated in step (d).

References Cited

UNITED STATES PATENTS

| | | | |
|---|---|---|---|
| 2,678,282 | 5/1954 | Jones | 106—65 |
| 3,128,194 | 4/1964 | Christie | 106—65 X |
| 3,336,108 | 8/1967 | Leatham et al. | 423—327 X |
| 3,533,738 | 10/1970 | Rundell et al. | 423—327 |

OTHER REFERENCES

Pankratz et al. "Low-Temperature Heat Capacity and High-Temperature Heat Content of Mullite" U.S. Bur-Mines Rept. Invest. 6287, (1963) page 2.

Shanefield et al. "The Western Electric Engineer" April 1971, pp. 26–31.

EDWARD J. MEROS, Primary Examiner

U.S. Cl. X.R.

106—65